United States Patent
Yu

(10) Patent No.: US 6,180,476 B1
(45) Date of Patent: *Jan. 30, 2001

(54) DUAL AMORPHIZATION IMPLANT PROCESS FOR ULTRA-SHALLOW DRAIN AND SOURCE EXTENSIONS

(75) Inventor: Bin Yu, Fremont, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/187,630

(22) Filed: Nov. 6, 1998

(51) Int. Cl.[7] .................................................. H01L 21/336
(52) U.S. Cl. ........................... 438/305; 438/306; 438/307; 438/516; 438/528; 438/530
(58) Field of Search ...................... 438/303, 305, 438/306, 307, 514, 516, 528, 530

(56) References Cited

U.S. PATENT DOCUMENTS

| | | | |
|---|---|---|---|
| 4,683,645 | * | 8/1987 | Naguib et al. .......................... 437/41 |
| 5,393,685 | * | 2/1995 | Yoo et al. ............................... 437/44 |
| 5,593,907 | * | 1/1997 | Anjum et al. .......................... 437/35 |
| 5,607,884 | * | 3/1997 | Byun ...................................... 437/41 |
| 5,793,090 | * | 8/1998 | Gardner et al. ...................... 257/408 |
| 5,811,323 | * | 9/1998 | Miyasaka et al. ................... 438/151 |
| 5,825,066 | * | 10/1998 | Buynoski ............................. 257/345 |

* cited by examiner

Primary Examiner—Long Pham
(74) Attorney, Agent, or Firm—Foley & Lardner

(57) ABSTRACT

A method of fabricating an integrated circuit with ultra-shallow source/drain junctions which utilizes a dual amorphization technique. The technique creates a shallow amorphous region and a deep amorphous region 300 nm thick. The shallow amorphous region is between 10–15 nm below the top surface of the substrate, and the deep amorphous region is between 150–200 nm below the top surface of the substrate. The shallow amorphous region helps to reduce ion implant channeling effects, and the deep amorphous region helps to getter point defects generated during dopant implants. The process can be utilized for P-channel or N-channel metal field effects semiconductor transistors (MOSFETs).

20 Claims, 3 Drawing Sheets

US 6,180,476 B1

DUAL AMORPHIZATION IMPLANT PROCESS FOR ULTRA-SHALLOW DRAIN AND SOURCE EXTENSIONS

CROSS REFERENCE TO RELATED APPLICATIONS

This patent application is related to U.S. application Ser. No. 09/187,890, by Yu et al., entitled "A Method of Fabricating an Integrated Circuit with Ultra-Shallow Drain/Source Extensions", U.S. application Ser. No. 09/187,635, by Yu, et al., entitled "A Damascene Process for Forming Ultra-Shallow Source/Drain Extensions in ULSI MOSFET", and U.S. application Ser. No. 09/187,172, by Yu, entitled "Recessed Channel Structure for Manufacturing Shallow Source/Drain Extensions" all filed on an even date herewith and assigned to the assignee of the present invention.

FIELD OF THE INVENTION

The present invention relates to integrated circuits and to methods of manufacturing integrated circuits. More particularly, the present invention relates to a method of manufacturing integrated circuits having transistors with ultra-shallow source/drain extensions.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-inducted barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or ion implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacer.

As transistors disposed on integrated circuits (ICs) become smaller, transistors with shallow and ultra-shallow source/drain extensions have become more difficult to manufacture. For example, smaller transistors should have ultra-shallow source and drain extensions (less than 30 or 40 nanometer (nm) junction depth). Forming source and drain extensions with junction depths of less than 30 nm is very difficult using conventional fabrication techniques. Conventional ion implantation and diffusion doping techniques make transistors on the IC susceptible to short-channeling effects, which result in a dopant profile tail distribution that extends deep into the substrate. Also, conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically into the bulk semiconductor substrate.

Thus, there is a need for a method of manufacturing ultra-shallow source and drain extensions that does not utilize a conventional double implant process. Further still, there is a need for transistors that have ultra-shallow junction source and drain extensions. Even further still, there is a need for an efficient method of manufacturing source and drain extensions that minimizes ion implantation channeling effect and TED effect.

SUMMARY OF THE INVENTION

The present invention relates to a method of manufacturing an integrated circuit. The method includes forming at least a portion of a gate structure on a top surface of a substrate, providing a pre-amorphization implant, doping the substrate for drain and source extension, providing a post-amorphization implant, providing spacers that abut the gate structure, doping the substrate to form source and drain regions, and thermally annealing the substrate. The pre-amorphization implant creates a first amorphous region near the top surface of the substrate, and the post-amorphization implant creates a deep amorphous region in the substrate.

The present invention still further relates to a method of manufacturing an ultra-large scale integrated circuit including a plurality of field effect transistors having shallow source and drain extensions. The method includes steps of forming at least a part of a gate structure on a top surface of a semiconductor substrate, providing a shallow amorphization implant, doping the substrate, providing a deep amorphization implant, providing spacers that abut the gate structure, doping the substrate to form source and drain regions, and thermally annealing the substrate, thereby forming source and drain extensions having a thickness of less than 30 nm. The shallow amorphization implant creates a shallow amorphous region near the top surface, and the deep amorphization implant creates a deep amorphous region in the substrate.

The present invention still further relates to a method of providing a plurality of ultra-shallow drain/source extensions for field effect transistors in an ultra-large scale integrated circuit. The method includes forming a plurality of at least a portion of gate structures on a top surface of a silicon substrate, providing a first amorphization implant, doping the substrate for the drain and source extensions, providing a second amorphization implant, providing spacers that abut the gate structure, doping the substrate to form source and drain regions, and thermally annealing the substrate to form the ultra-shallow drain/source extensions. The first amorphization implant creates a first amorphous semiconductor region near the top surface of the substrate, and the second amorphization implant creates a deep amorphous region in the substrate.

DETAILED DESCRIPTION OF THE PREFERRED EXEMPLARY EMBODIMENTS

Figure 1:
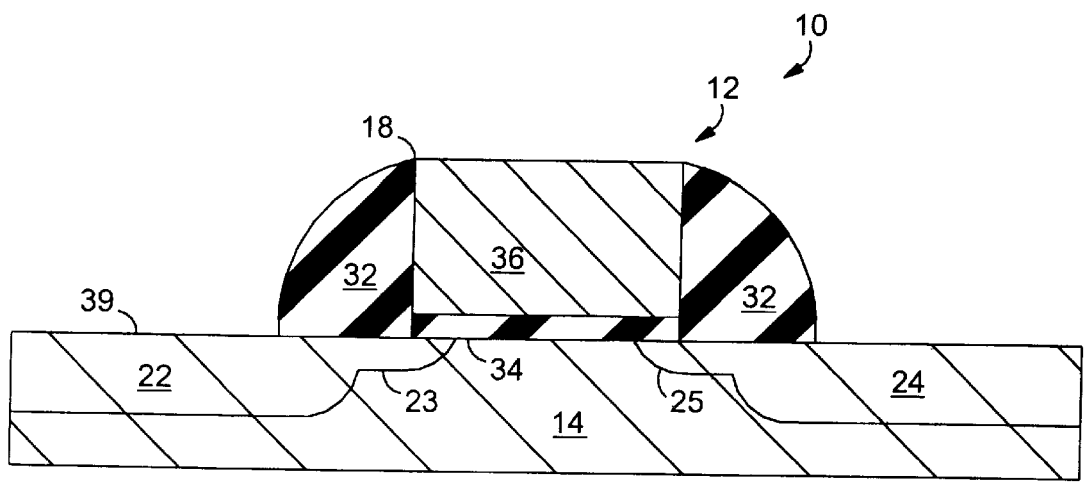
FIG. 1 is a cross-sectional view of a portion of an integrated circuit having a transistor with shallow source/drain extensions in accordance with an exemplary embodiment of the present invention.

With reference to FIG. 1, a portion 10 includes a transistor 12 that is disposed on a semiconductor substrate 14, such as, a single crystal silicon wafer. Transistor 12 is part of an integrated circuit (IC) manufactured on a wafer (such as, a silicon wafer). Transistor 12 includes a gate structure 18, a source region 22, and a drain region 24. Transistor 12 also includes a source extension 23 and a drain extension 25.

Extensions 23 and 25 are preferably ultra-shallow extensions (e.g., junction depth less than 30–40 nanometers (nm)), which are thinner than regions 22 and 24. Extensions 23 and 25 are connected to regions 22 and 24, respectively, and are disposed partially underneath a gate oxide 34. Ultra-shallow extensions 23 and 25 help transistor 12 achieve substantial immunity to short-channel effects. Short-channel effects can degrade performance of transistor 12 as well as the manufacturability of the IC associated with transistor 12.

Transistor 12 can be an N-channel or a P-channel field effect transistor, such as, a metal oxide semiconductor field effect transistor (MOSFET). Transistor 12 is preferably part of an ultra-large scale integrated (ULSI) circuit that includes one million or more transistors.

Gate structure 18 includes spacers 32, gate oxide 34, and a polysilicon gate conductor 36. Gate oxide 34 is preferably thermally grown on substrate 14 as a silicon dioxide layer. Spacers 32 and conductor 36 are preferably deposited by chemical vapor deposition (CVD) and etched to form the particular structures for transistor 12. Spacers 32 are preferably silicon dioxide or silicon nitride ($Si_3N_4$). Gate oxide 34 can be from 2–8 nm thick.

Figure 2:
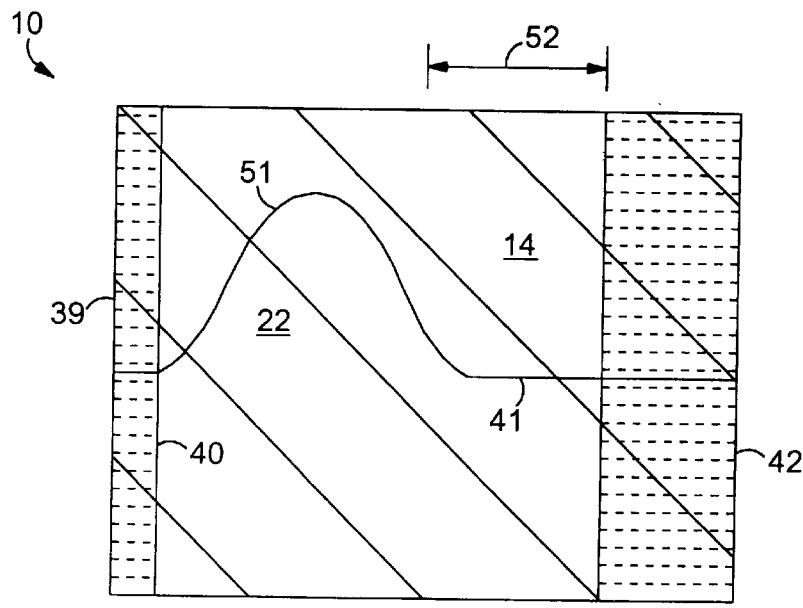
FIG. 2 is a cross-sectional view of the portion of the integrated circuit illustrated in FIG. 1, showing a dopant implant profile.

With reference to FIG. 2, a dopant profile for source region 22 is demonstrated by a line 41. The concentration of dopants is higher in the middle of source region 22 between a pre-amorphization implant region 40 and a post-amorphization implant region 42. Regions 40 and 42 are described in more detail below with reference to FIGS. 1 and 4. Line 40 indicates a high concentration of dopants closer to a top surface 39 and a lower, more consistent concentration of dopants in a region 52 between region 51 and implant region 42.

Region 40 provides a screening amorphous silicon layer close to a top surface 39 of substrate 14. Region 40 preferably extends 10–15 nanometers below top surface 39 of substrate 14. Region 40 reduces the ion implantation channel effect associated with the manufacture of transistor 12.

Implant 42 is preferably between 150 to 200 nanometers below top surface 39 of substrate 14. The implant ion process associated with region 42 getters (alleviates) point defects generated during dopant implant and, thereby, reduces transient enhanced diffusion (TED) effect. Reducing TED effect allows ultra-shallow extensions 23 and 25 to be achieved. Thus, the dual amorphization (e.g., regions 40 and 42) minimizes the ion implantation channeling effect and TED effect associated with transistor 12.

Figure 3:
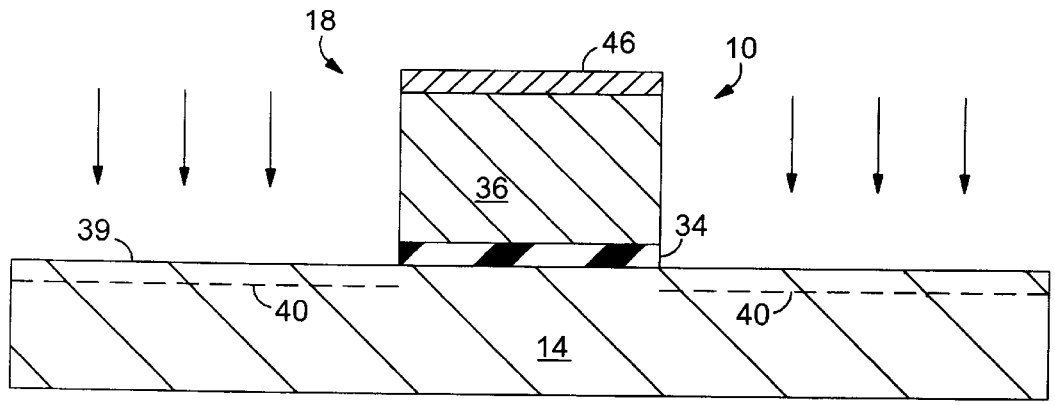
FIG. 3 is a cross-sectional view of the portion of the integrated circuit illustrated in FIG. 1, showing a gate stack formation and pre-amorphization implant step.

With reference to FIGS. 1–6, the fabrication of transistor 12, including source extension 23 and drain extension 25, is described below as follows. In FIG. 3, transistor 12 can be substantially formed by conventional semiconductor processing techniques to include gate structure 18, which includes gate oxide 34 and gate conductor 36.

Additionally, structure 18 includes a 300 angstrom–400 angstrom silicon oxynitride (SiON) cap layer 46. Layer 46 protects conductor 36 during subsequent processing steps. Layer 46 is deposited by chemical vapor deposition and selectively etched. Alternatively, other barrier materials can be utilized to protect conductor 36.

Portion 10 and substrate 14 are subjected to a shallow pre-amorphization implant (PAI) to form implant regions 40. Implant regions 40 are preferably amorphous silicon provided between 10–15 nm below top surface 39 of substrate 14. Regions 40 can be created by subjecting substrate 14 to an ion implantation technique. The ion implantation technique can charge semiconductor ions, such as, silicon or germanium ions, to approximately 10–100 kiloelectron volts (keVs) and implant them into substrate 14. Ion implantation can be performed by implantation devices manufactured by companies, such as, Varian Company of Palo Alta, Calif., Genius Company, and Applied Materials, Inc. The silicon and germanium ions change the single crystal silicon associated with substrate 14 into amorphous silicon at region 40. The amorphous silicon associated with region 40 is represented by a dashed line in the figures.

Figure 4:
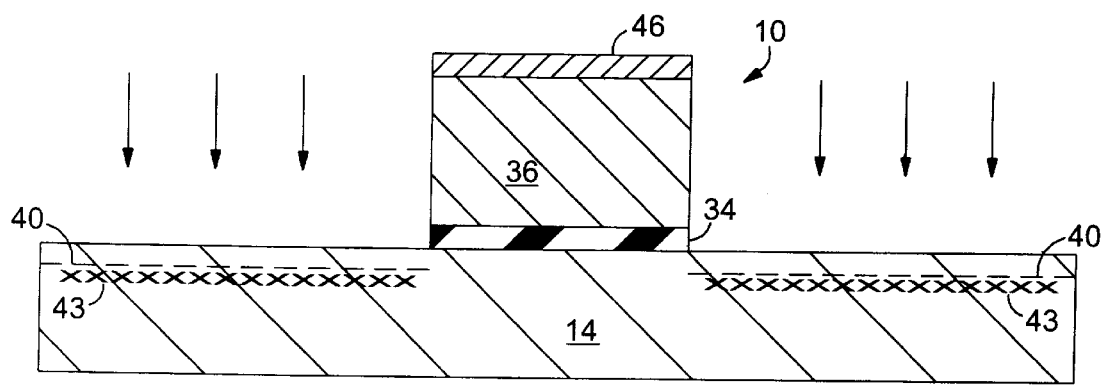
FIG. 4 is a cross-sectional view of the portion of the integrated circuit illustrated in FIG. 1, showing a dopant implant step.

In FIG. 4, substrate 14 is subjected to a dopant implant 43, represented by the symbol x the symbol below surface 39. The dopant implant can be arsenic, boron difluoride ($BF_2$), indium, phosphorous, or any appropriate dopant for semiconductor fabrication operations. Implant 43 is performed at a dose of $10^{13}$ dopants per $cm^2$.

Figure 5:
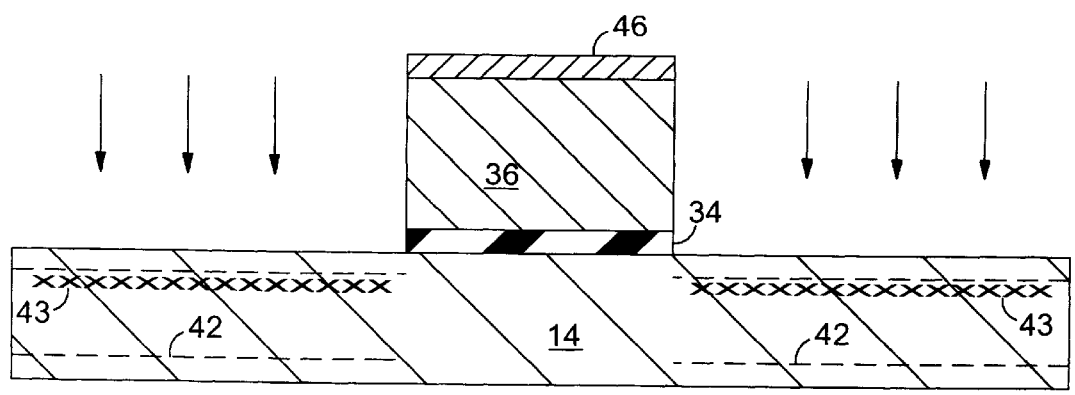
FIG. 5 is a cross-sectional view of the portion of the integrated circuit illustrated in FIG. 1, showing a post-amorphization implant step.

In FIG. 5, substrate 14 is subjected to a deep post-amorphization implant to form implant regions 42. Implant regions 42 are preferably amorphous silicon at a depth of approximately 150–200 nm. Regions 42 are formed by subjecting substrate 14 to an ion implantation technique, wherein silicon or germanium atoms are implanted to a depth between 150–200 nm. Region 42 is represented as a dashed line in the figures. The implantation techniques for forming regions 42 is similar to the technique for forming regions 40, except that the ions used to form regions 42 are more highly charged.

Figure 6:
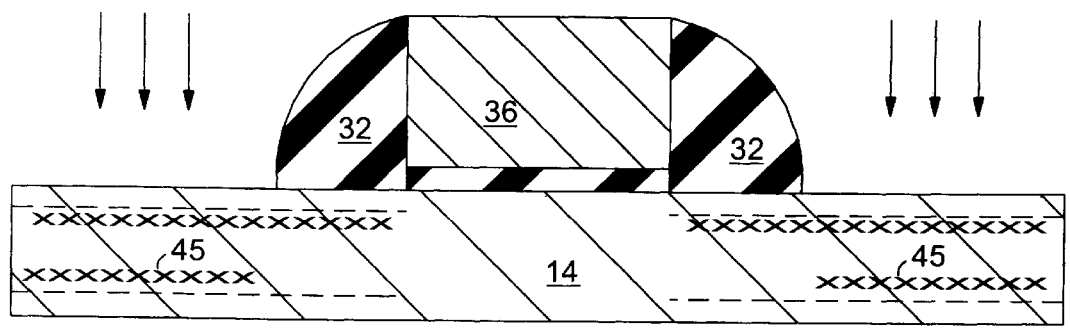
FIG. 6 is a cross-sectional view of the portion of the integrated circuit illustrated in FIG. 1, showing a source and drain implant step.

With reference to FIG. 6, cap layer 46 is removed from gate structure by a stripping technique. The stripping technique can be a chemical wet-etch technique, dry-etch technique, or any method for appropriately removing layer 46 from conductor 36. Layer 46 serves to protect conductor 36 during the implantation steps associated with regions 40 and 42 and the doping steps associated with implant 43.

After layer 46 is stripped, spacers 32 are formed by depositing a silicon dioxide layer and then selectively etching to leave spacers 32. After spacers 32 are formed, substrate 14 is doped to form dopant implant 45 (source region 22 and drain region 24 (FIG. 1)). The dopants associated with the source and drain doping step of region 45 are represented by a second row of the symbol x in FIG. 6.

The formation of regions 42 getters point defects generated during a previous dopant implant step (formation of implant 43) associated with source extension 23 and drain extension 25. Further, vacancies generated by the formulation of regions 42 in substrate 14 can serve to compensate the interstitials generated by the dopant implant. Therefore, the defect density associated with the region 52 (FIG. 2) can be reduced. This reduction of the net defect density in region 52 reduces the TED effect so ultra-shallow junctions for extension 23 and 25 can be formed. Implant 45 is performed at a dose of $10^{15}$ dopants per cm$^2$.

With reference to FIG. 1, substrate 14 is subject to rapid thermal annealing to form the shallow source extension 23 and drain extension 25 as well as deep contact junctions for source region 22 and drain region 24. Dopants in extensions 23 and 25 and in regions 22 and 24 are activated in this step. Conventional CMOS processes can be utilized to complete the formation of transistor 12 and portion 10 by forming contacts, interconnects, or other structures.

Transistor 12 advantageously reduces the junction leakage current due to the reduction of point defect density near the deep source and drain contact junction. Preferably, amorphization implants are completed before the oxide spacer formation and before rapid thermal annealing. The rapid thermal annealing transforms regions 40 and 42 into single crystal silicon with actuated dopants.

It is understood that, while preferred embodiments, examples, materials, and values are given, they are for the purpose of illustration only. The apparatus and method of the invention are not limited to the precise details and conditions disclosed. For example, although two fabrication methods utilizing ion implantation are discussed, other dual amorphization techniques and methods could utilize the principles of the present invention to create ultra-shallow source and drain extensions. Thus, changes may be made to the details disclosed without departing from the spirit of the invention, which is defined by the following claims.

What is claimed is:

1. A method of manufacturing an ultra-large scale integrated circuit, the integrated circuit including a plurality of field effect transistors having ultra-shallow drain and source extensions comprising:

forming at least a portion of a gate structure on a top surface of a silicon substrate;

providing a pre-amorphization implant, the pre-amorphization implant creating a first amorphous region near the top surface of the substrate;

first doping the first amorphous region near the top surface of the substrate for the ultra-shallow drain and source extensions;

providing a post-amorphization implant, the post-amorphization implant creating a deep amorphous region in the substrate;

providing spacers, the spacers abutting the gate structure;

second doping the deep amorphous region in the substrate to form deep source and drain regions; and thermally annealing the substrate to form the ultra-shallow drain and source extensions.

2. The method of claim 1, wherein the deep amorphous region is 150–200 nm below the top surface.

3. The method of claim 2, wherein the first amorphous region is 10–15 nm below the surface.

4. The method of claim 3, wherein the first and second doping steps utilize boron or phosphorous.

5. The method of claim 1, wherein the spacers are oxide.

6. The method of claim 5, wherein providing the spacers step is performed before the second doping step.

7. The method of claim 6, wherein providing the spacers step is performed after the first doping step.

8. The method of claim 1 further comprising:

providing the pre-amorphization implant before the first doping step.

9. The method of claim 1, wherein the annealing step is a rapid thermal annealing step.

10. A method of manufacturing an ultra-large scale integrated circuit including a plurality of field effect transistors having shallow source and drain extensions, the method comprising steps of:

forming at least part of a gate structure on a top surface of a semiconductor substrate;

providing a shallow amorphization implant, the shallow amorphization implant creating a shallow amorphous region near the top surface;

first doping the shallow amorphous region near the top surface for the shallow source and drain extensions;

providing a deep amorphization implant, the deep amorphization implant creating a deep amorphous region in the substrate;

providing spacers, the spacers abutting the gate structure;

second doping the deep amorphous region in the substrate to form source and drain regions; and thermally annealing the substrate forming to the shallow source and drain extensions having a thickness of less than 30 nm.

11. The method of claim 10, wherein the first doping step utilizes As or BF$_2$.

12. The method of claim 10, wherein the second doping step utilizes boron or phosphorous.

13. The method of claim 10, wherein the gate structure includes a polysilicon conductor.

14. The method of claim 13, wherein the thermal annealing step heats the substrate to approximately 900° C.

15. The method of claim 11, wherein the part includes at least a polysilicon conductor and a gate oxide.

16. A method of providing a plurality of ultra-shallow drain/source extensions for field effect transistors associated with an ultra-large scale integrated circuit, the method comprising:

forming a plurality of at least a portion of gate structures on a top surface of a silicon substrate;

providing a first amorphization implant, the first amorphization implant creating a first amorphous semiconductor region near the top surface of the substrate;

doping the first amorphous region near the top surface of the substrate for the drain and source extensions;

providing a second amorphization implant, the second amorphization implant creating a deep amorphous semiconductor region in the substrate;

providing spacers, the spacers abutting the gate structures;

doping the deep amorphous region in the substrate to form source and drain regions; and thermally annealing the substrate to form the ultra-shallow drain/source extensions.

17. The method of claim 16, wherein the gate structure includes a cap layer.

18. The method of claim 17, wherein the first amorphous semiconductor region is less than 10–15 nm below the top surface, and the deep amorphous semiconductor region is more than 150–200 nm below the top surface.

19. The method of claim 18, wherein the thermal annealing is performed by rapidly heating the substrate.

20. The method of claim 18, wherein the extensions are less than 30 nm deep.

* * * * *